(12) United States Patent
Barbee et al.

(10) Patent No.: US 7,679,201 B2
(45) Date of Patent: Mar. 16, 2010

(54) DEVICE PACKAGE

(75) Inventors: Ronald Frederick Barbee, Tigard, OR (US); Glenn Robertson, Tualatin, OR (US); Robert Peene, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1011 days.

(21) Appl. No.: 11/312,880

(22) Filed: Dec. 20, 2005

(65) Prior Publication Data

US 2007/0138611 A1     Jun. 21, 2007

(51) Int. Cl.
  *H01L 23/48* (2006.01)
  *H01L 23/52* (2006.01)
(52) U.S. Cl. ...................................... 257/786; 257/778
(58) Field of Classification Search ................. 257/786, 257/778, 698, 784
See application file for complete search history.

(56) References Cited

U.S. PATENT DOCUMENTS

| 6,433,419 | B2 | 8/2002 | Khandros et al. | |
|---|---|---|---|---|
| 7,109,573 | B2 * | 9/2006 | Nurminen | 257/675 |
| 2002/0034066 | A1 * | 3/2002 | Huang et al. | 361/704 |
| 2007/0045824 | A1 * | 3/2007 | Zhao et al. | 257/706 |

* cited by examiner

*Primary Examiner*—S. V Clark
(74) *Attorney, Agent, or Firm*—Schwegman, Lundberg & Woessner, P.A.

(57) ABSTRACT

A package includes a device and a package substrate. The device includes a plurality of electrical pads, and has a periphery that defines a footprint. The package substrate, further includes a first substrate surface to which the device is attached, a second substrate surface, and a set of electrical contacts attached to the second substrate surface.

22 Claims, 7 Drawing Sheets

DEVICE PACKAGE

BACKGROUND

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die and on the exterior of the semiconductor packages that receive the die, for connecting the packaged device to external systems, such as a printed circuit board.

Package development with each generation continues in complexity with continued process evolution and smaller more dense packages. Ball Grid Array (BGA) packages have decreased in ball pitch where 0.5 mm pitch is becoming common. Trace pitch on substrates are found in many products to 25 um. As dimensions scale the difficulties with noise and impedance control and variance become greater. Increased interconnect densities with future silicon technologies increase at a faster rate than package substrate interconnect density. With cost and footprint size a major consideration especially in the development of new mixed signal and RF products, the use and availability from suppliers of Chip Scale Packaging (CSP) on Molded Matrix Array Packaging (MMAP) technology is also increasing.

In development of digital and mixed signal designs (with both digital and analog circuits in the product) as well as RF products, the layout of the package substrate on BGA packages can be critical. Performance is impacted by trace length, substrate dielectric constant variation, trace matching, coupling effects, bond wire lengths, bond wire spacing, and loop radius. For flip chip product packages with dense bump arrays, the trace pitch requirements are tighter and routings are limited in the die bump array area.

Packages generally have two levels. The first level of packaging details the attachment of the die to the package substrate. The substrate acts as an interposer. The second level of packaging details the attachment of the package formed to a printed circuit board. One type of second level attachment of the package includes a plurality of either balls, pins, or lands formed in an array and disposed on a major surface of a substrate. The balls, pins or lands connect the semiconductor package to a printed circuit board or the like. A typical package may have from tens to over a thousand solder balls, pins or lands in the array. The die is assembled to a matching array of conductive pads or pin receiving openings.

In the case of a BGA package the die pads are connected to the substrate by "flip chip" or "wire bond" technology and connected to circuitry on a circuit board through the balls attached to the substrate. In the case of flip chip attachment, heat is applied to reflow the solder bumps to place the die to the substrate, thereby wetting the pads on the substrate and, once cooled, forming electrical connections between the package and the semiconductor device contained in the package. For wire bond connection, the die is typically glued to the substrate and the die bond pads are connected to the package substrate using gold wire. For connection to the circuit board to which the package is mounted, solder balls are attached to the substrate to printed pads on the substrate. Heat is applied to reflow the solder balls, thereby wetting the pads on the substrate and board, and once cooled, forming electrical connections between the package and the printed circuit board.

In the case of a pin grid array, the pins are connected to openings in the printed circuit board, such as the drill hole vias. The pins are soldered into place once the package has been inserted into the board.

In the case of a land grid array, the lands are directly soldered on the printed circuit board using solder paste or connected to the board using specially designed socket.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

In the following detailed description of the example embodiments, reference is made to the accompanying drawings that form a part hereof, and in which are shown by way of illustrating specific example embodiments. The example embodiments illustrated are described in sufficient detail to enable those skilled in the art to practice the teachings disclosed herein. Other example embodiments can be utilized and derived therefrom, such that structural and logical substitutions and changes can be made without departing from the scope of the claims. The following detailed description, therefore, is not to be taken in a limiting sense, and the scope of various embodiments is defined only by the appended claims, along with the full range of equivalents to which such claims are entitled.

Figure 1:
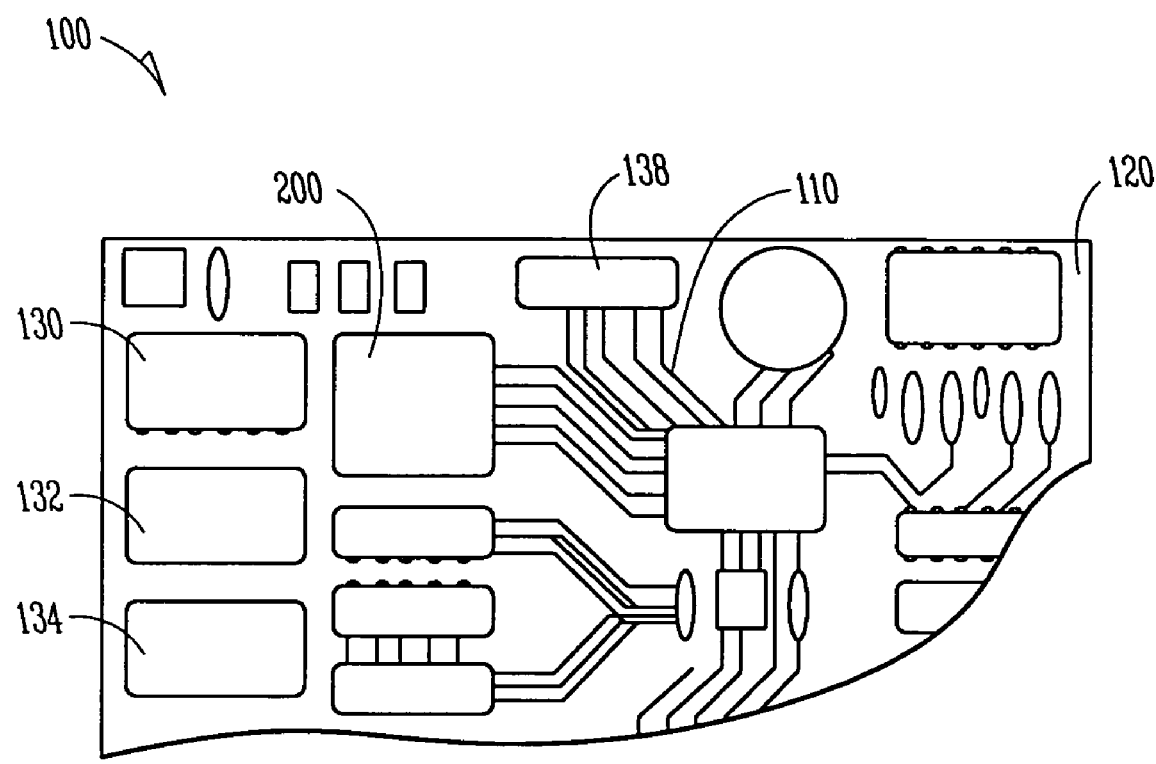
FIG. 1 illustrates a top, partial cutaway view of a printed circuit board that includes package to package interconnectivity, according to an example embodiment.

FIG. 1 is a top, partial cutaway view of a printed circuit board 100 that includes at least one package 200, according to an embodiment of the invention. The printed circuit board ("PCB") 100 is a multi-layer resin board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of a printed circuit board 100 and also can be found on the various layers within the printed circuit board 100. The printed circuit board 100 is populated with various components 130, 132, 134, 138 and 200. The components 130, 132, 134, 138 and 200 can either be discrete components or semiconductor chips which include thousands of transistors. The components 130, 132, 134, 138 and 200 can use any number of technologies to connect to the exterior surface 120 of the circuit board or to the printed circuit board 100. For example, pins may be inserted into plated through holes or pins may be extended through the printed circuit board 100. An alternative technology is surface mount technology where an electrical component, such as component 200, mounts to an array of pads on the exterior surface 120 of the printed circuit board. For example, component 200 could be a ball grid array package or device that has an array of balls or bumps that interact or are connected to a corresponding array of pads on the exterior surface 120 of the printed circuit board 100. The printed circuit board 100 can also include connectors for making external connections to other electrical or electronic devices.

As shown in FIG. 1 there are external traces, such as electrical trace 110, on the external surface 120 of the printed circuit board 100 that connect to one or more outputs and inputs associated with the printed circuit board 100.

Once populated, many of the printed circuit boards are referred to as cards or adapters. Printed circuit boards are prevalent and are used in computing systems, such as computers and other devices. Printed circuit boards used in computers include motherboards, expansion boards, daughter cards, controller cards, network interface cards, or video adapters or video graphics adapters. It should be noted that these are just a small sample of the many different types of electronic devices that are based upon a printed circuit board populated with various components 130, 132, 134, 138 and 200, such as the one shown in FIG. 1. Populated printed circuit boards are used in many applications and in many environments.

Figure 2:
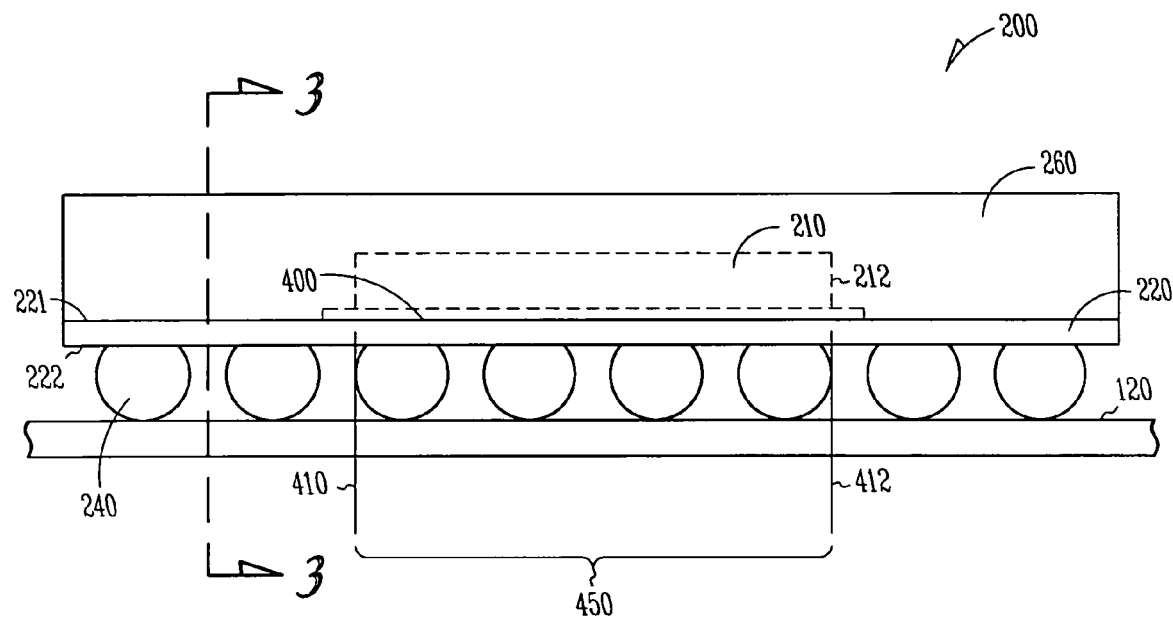
FIG. 2 illustrates a side view of a package attached to a printed circuit board, according to an example embodiment.
Figure 3:
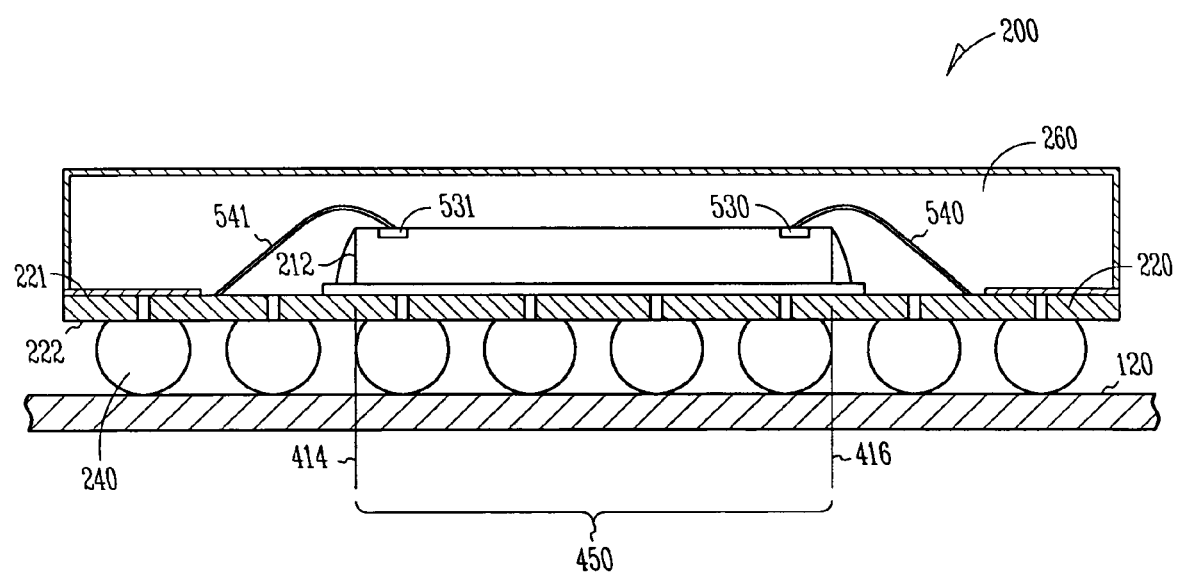
FIG. 3 illustrates a cut away cross sectional side view of a package attached to a printed circuit board along line 3-3 of FIG. 2, according to an example embodiment.

FIG. 2 illustrates a side view of a package 200 attached to a printed circuit board 120, according to an example embodiment. FIG. 3 illustrates a cut away side view of a package 200 attached to a printed circuit board 120 along line 3-3 of FIG. 2, according to an example embodiment. Now referring to FIGS. 2 and 3, the package 200 will be further detailed. The package 200 includes a device 210 (shown in phantom in FIG. 2) and a package substrate 220. The device 210 includes a plurality of electrical pads 530, 531 (also shown in FIG. 5), and has a periphery 212 that defines a footprint 400. As shown in FIG. 2, the footprint 400 includes a first side 410 and a second side 412. As shown in FIG. 3, the footprint includes a third side 414 and a fourth side 416. The package substrate 220, further includes a first substrate surface 221 to which the device 210 is attached, a second substrate surface 222, and a set of electrical contacts 240 attached to the second substrate surface 222. It should be noted that the electrical contacts 240 shown in FIGS. 2 and 3 are solder balls associated with a ball grid array. Other example embodiments, shown in later figures, include other types of electrical contacts, such as lands formed in an array and referred to as a land grid array (LGA) or pins formed in an array and referred to as a pin grid array (PGA). Other types of electrical contacts are also contemplated. The volume below the device 210 or below the footprint 400 of the device 210 is also referred to as a shadow 450. The electrical contacts 240 below a footprint 400 of the device 220 are not electrically connected to the electrical pads 530, 531 of the device 210. Another way of stating this is that the electrical contacts 240 within the shadow 450 of the device 210 are not electrically connected to the electrical pads 530, 531 of the device 210. The package substrate 220 includes electrical conductors for electrically connecting at least one of the electrical contacts 240 attached to the second substrate surface 222 to the electrical pads 530, 531 of the device 210. In some example embodiments, the device 210 includes bonding wires, such as gold bonding wires 540, 541 (shown in FIG. 3), which attach the pads 530, 531 to corresponding pads on the first substrate surface 221 of the package substrate 220. The package substrate 220 includes conductors that are internal to the package substrate 220 that couple a pad on the first substrate surface 221 to an electrical contact 240 on the second substrate surface 222. These conductors will be further detailed in other figures.

In some embodiments, the electrical contacts 240 are arranged in an array on the second substrate surface 222 of the package substrate 220. The electrical contacts 240, as shown in FIGS. 2 and 3, include solder balls. In other example embodiments, the contacts can include pins, lands, or the like. In some example embodiments, pins and lands are also arranged in an array to form either a PGA or LGA, respectively. In some embodiments, the package 200 includes an encapsulant 260 that encapsulates the device 210. In still other example embodiments, the encapsulant 260 surrounds or encapsulates gold boding wires 540, 541 and also covers at least a portion of the first substrate surface 221 of the package 200. The encapsulant 260 ruggedizes the package 200 so that it is more able to withstand and survive shock load events or other similar events.

It should be noted that the device 210 can be any type of device including a silicon based die. As shown in FIG. 3, the device includes electrical contacts or pads that are on a major surface of the device 210 that is remote from the first substrate surface 221. In other embodiments, the electrical contacts or pads on the device may be positioned adjacent the first substrate surface 221. In one embodiment, the device is a flip chip and has pads or contacts on the surface of the device 210 adjacent the first substrate surface 221. The device 210 may be any type of device, including a processor, a controller, dedicated controller or a microprocessor. The device 210 may also be a chip or a semiconductor chip. The device 210, as shown in FIGS. 2 and 3 can be attached to the substrate 220 and specifically to a copper layer on the substrate 220.

Figure 4:
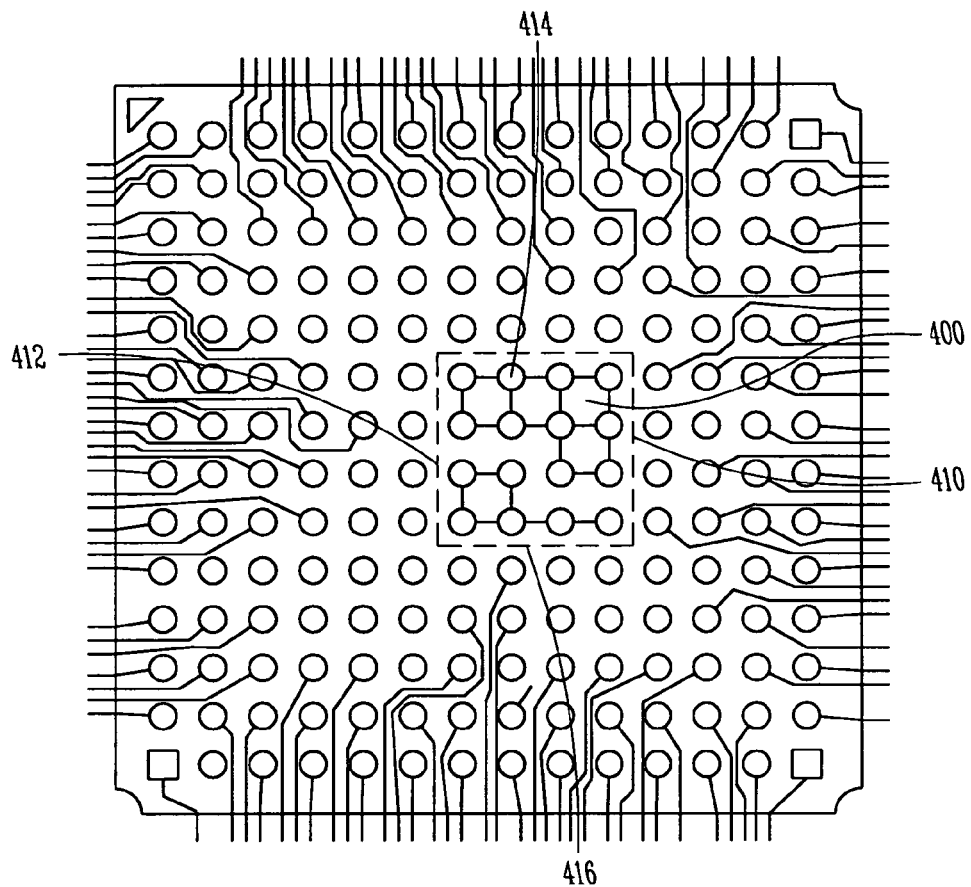
FIG. 4 illustrates a top view of a bottom layer copper circuit on the substrate and the footprint area of the package which is positioned below the device attached to the package substrate, according to an example embodiment.
Figure 5:
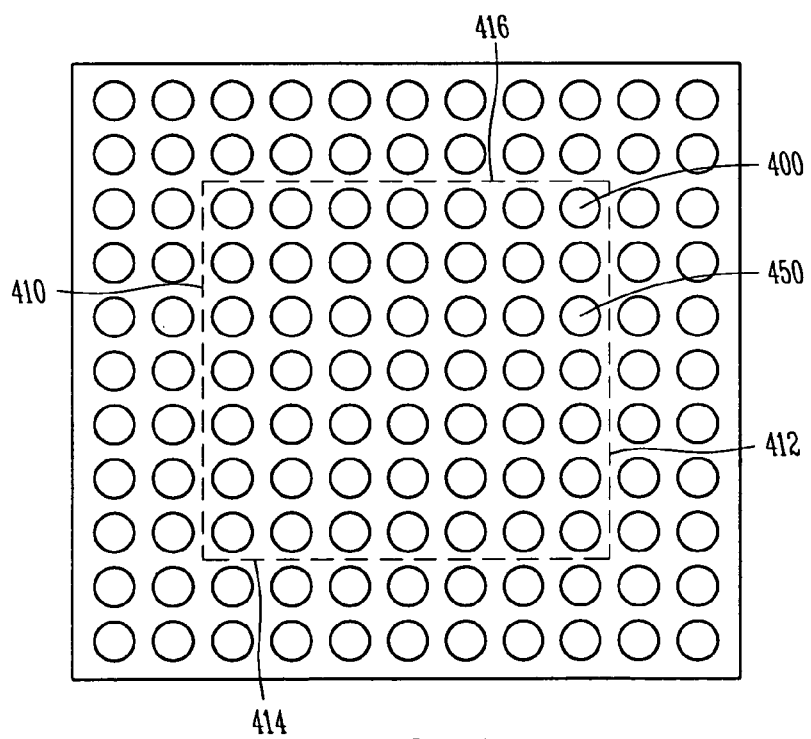
FIG. 5 illustrates a bottom view of a package showing a ball grid array and showing the die footprint area bounded by a hidden dashed line, according to an example embodiment.

FIG. 4 illustrates a top view of a footprint area 400 of the package 200 which is positioned below the device 210 attached to the package substrate 220, according to an example embodiment. FIG. 5 illustrates a bottom view of a package 200 showing a BGA and showing the footprint area 400 bounded by a hidden line, according to an example embodiment. Now referring to both FIGS. 4 and 5, the footprint area 400 and the shadow 450 will be discussed. The footprint area 400 is bounded by a line 410, a line 412, a line 414 and a line 416. The lines 410, 412, 414, 416 correspond to the periphery of the device 210 (shown in FIGS. 2 and 3). The footprint area 400 is the space within the box or rectangle formed by the lines 410, 412, 414, 416. The footprint 400 is an area. A volume which includes the footprint area 400 forms the shadow 450 of the device 210 (shown in FIGS. 2 and 3). The shadow 450 is essentially a parallel piped. In some embodiments, the shadow 450 only includes the volume below the device 210 (shown in FIGS. 2 and 3) or in a direction that includes at least one major surface of the device 210, the first substrate surface 221, the second substrate surface 222, and the electrical contacts attached to or associated with the second substrate surface 222 (shown in FIGS. 2 and 3).

Figure 6:
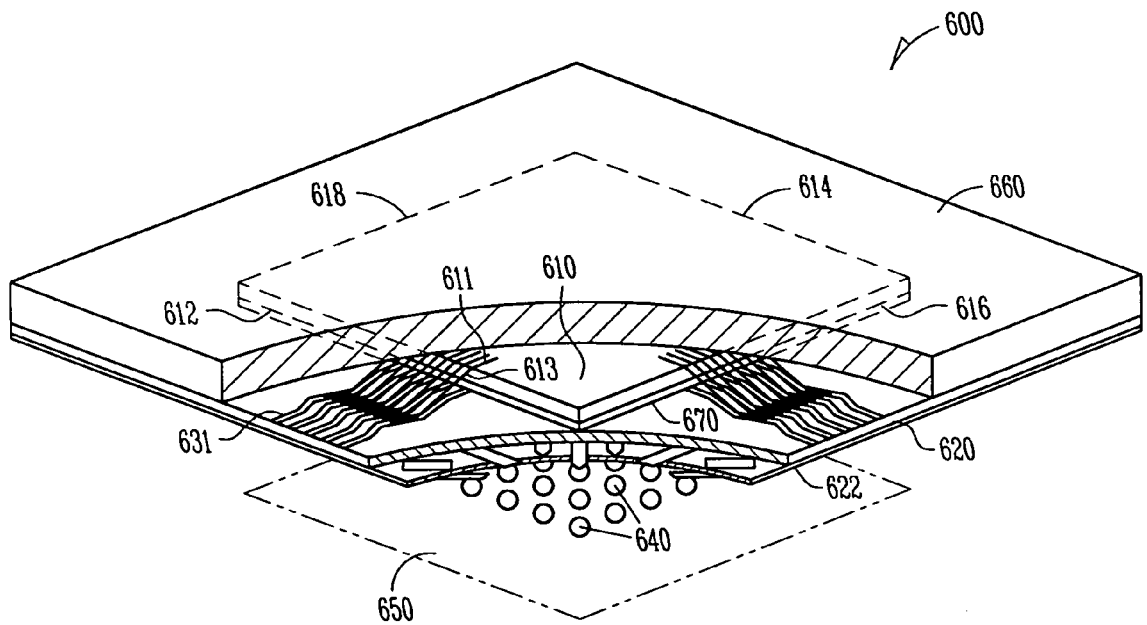
FIG. 6 illustrates a three dimensional cut away perspective view of a package, according to an example embodiment.

FIG. 6 illustrates a cut away perspective view of a package 600, according to an example embodiment. The package 600 includes a substrate 620. The substrate 620 can include any number of layers, such as a two-layer or four-layer laminate structure. The substrate or package substrate 620 includes conductive pathways routed through the laminated layers of the package substrate 620 and electrically connect a solder ball, such as solder ball 640, to a contact 631 on an opposite surface of the package substrate 620. The package 600 also includes a device 610. The device 610 includes pads 611 on a major surface of the device 610 most distal from the package substrate 620. A gold or other bonding wire 613 is used to connect the pads 611 of the device 610 to the pads 631 of the substrate 620. The device 610 is attached to the package substrate 620 with a conductive adhesive 670. The conductive adhesive 670 is generally thermally conductive. The thermally conductive adhesive transfers heat from the device 610 to the printed circuit board and through the area or volume below the device 610. The device 610 has a periphery depicted by lines 612, 614, 616 and 618. The lines 612, 614, 616, 618 correspond to the edges of the device 610. The area within the lines 612, 614, 616, 618 and between the device 610 and the package substrate 620 define a footprint of the device 610. A volume above and below the lines that includes the plane bounded by the lines, or includes the footprint, is also defined as a shadow 650. The contacts or solder balls such as 640 within the shadow volume 650 are not electrically connected to pads, such as pad 611 of the device 610. The solder balls 640 or contacts within the shadow 650 are capable of conducting heat or thermal energy away from the die or device 610 after the heat has passed through the package substrate 620. The package substrate also includes an encapsulant 660. The encapsulant 660 covers the device 610, the gold or wire bond 612, and the pads, such as pads 631 that are on one surface of the package substrate 620. The package substrate 620 is generally a laminate, rigid substrate that is generally referred to as a rigid substrate.

Figure 7:
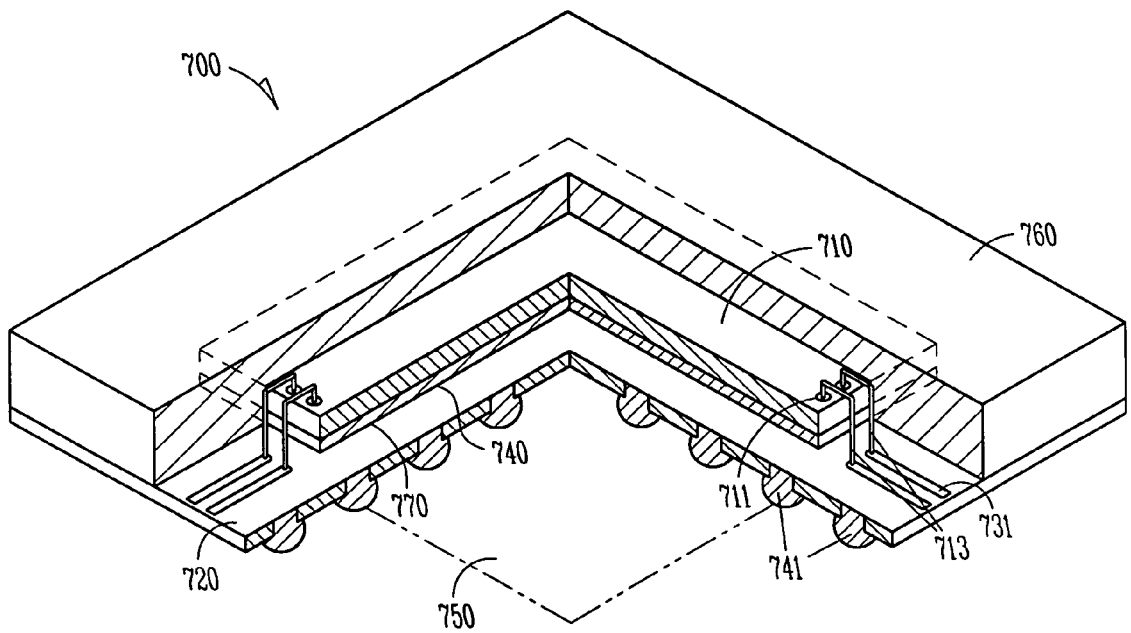
FIG. 7 illustrates a three dimensional cut away perspective view of a package, according to another example embodiment.

FIG. 7 illustrates a cut away perspective view of a package 700, according to another example embodiment. The example embodiment of the package 700 includes a semi-rigid or flexible package substrate 720. The flexible package substrate 720 is made of a polyimide or resin material or similar flexible material. Attached to the flexible substrate 720 is a die or device 710. The die or device 710 is attached to the flexible substrate 720 using a die attach material such as a thermally conductive adhesive 770. The die or device 710 includes pads 711 on one surface of the device. A wire bond 713 is attached to the pad 711. The wire bond 713 is attached to a trace 731 associated with the flexible or semi-rigid substrate 720. The trace 731 is electrically connected to an electrical contact such as a solder ball 741 that is outside of a shadow 750 or not below a footprint 740 of the device 710. The device and the wire bonds 713 and the die attach material 770 are covered by encapsulant 760. The encapsulant 760, made of plastic or another encapsulate material, also covers a portion of the flexible or semi-rigid package substrate 720.

FIG. 7 shows that a package can also be made that include a flexible substrate 720, such as a substrate made from polyimide material. It should be noted that in other embodiments, the pads, such as pad 711, associated with a device 710 need not necessarily be on the surface most distant from the package substrate 720. In other embodiments, a device such as a flip chip can be used where the pads of the device would be adjacent the polyimide or flexible package substrate 720.

Figure 8:
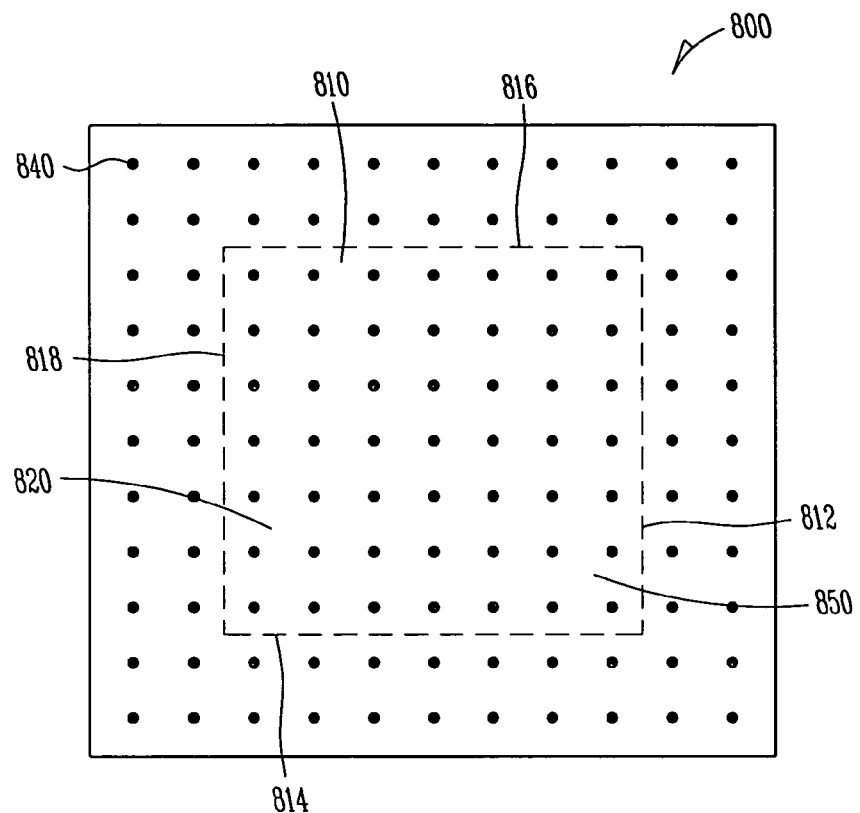
FIG. 8 illustrates a bottom view of a package showing a pin grid array-and showing the die footprint area bounded by a hidden dashed line, according to an example embodiment.

FIG. 8 illustrates a bottom view of a package 800 showing a pin grid array and showing a footprint area 820 bounded by hidden lines 812, 814, 816 and 818, according to an example embodiment. The lines 812, 814, 816 and 818 correspond to the edges of a device 810 that is part of the package 800. The area bound by the lines 812, 814, 816 and 818 defines the footprint of the device 810. A volume that includes the plane of the footprint is also known as the shadow 850 of the device 810. All of the pins 840 within the shadow or below the footprint of the device 810 are not electrically connected to the device 810.

Figure 9:
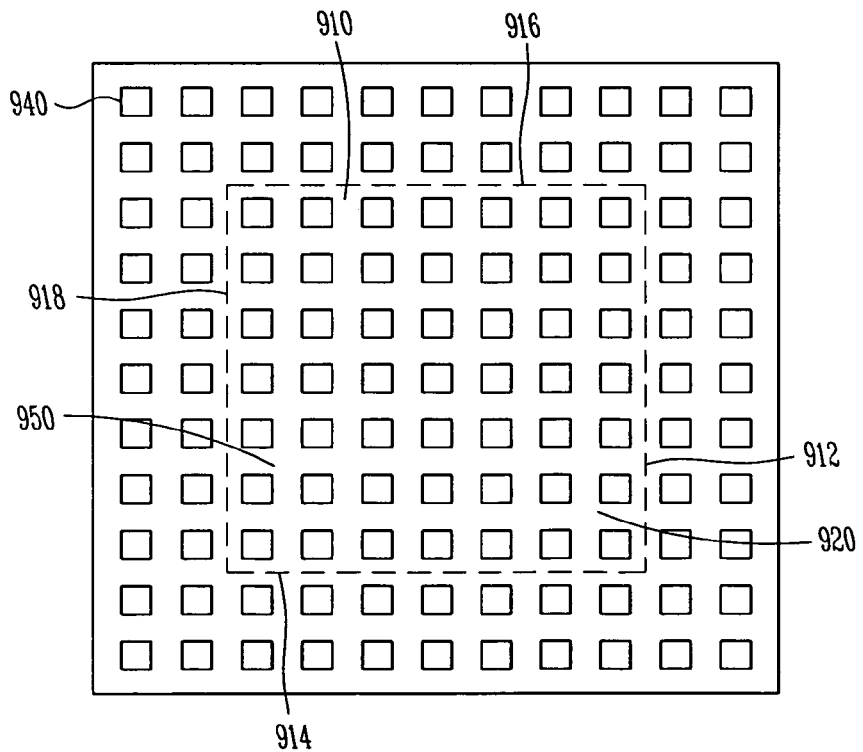
FIG. 9 illustrates a bottom view of a package showing a land grid array and showing the footprint area bounded by a hidden dashed line, according to an example embodiment.

FIG. 9 illustrates a bottom view of a package 900 showing an array of LANDs 940 and showing a footprint area bounded by hidden lines 912, 914, 916 and 918. The lines 912, 914, 916, 918 correspond to the edges of a device 910 attached to the package substrate. The area bound by the lines 912, 914, 916, 918 defines the footprint of the device 910. The area bound by the lines 912, 914, 916 and 918 defines the footprint 920 of the device 910. A volume that includes the plane of the footprint is also known as the shadow 950 of the device 910. All of the lands 940 within the shadow or below the footprint of the device 910 are not electrically connected to the device 910. It should be noted that in other embodiments of the device, different types of contacts can be used as part of a package and still be considered a contact or electrical contact.

Another example embodiment is directed to the package substrate 220. Referring back once again to FIGS. 2 and 3, the package substrate 220 includes a plurality of pads on one surface 221, and an area adapted to receive a device. The area corresponding to an outer periphery of a device 210 defines a shadow 450. The package substrate 220 also includes a plurality of electrical contacts on another surface 222 of the package substrate. Conductive pathways electrically connect at least a portion of the plurality of pads to at least a portion of the plurality of electrical contacts, such as contacts 240. The electrical contacts 240 within the shadow 450 are adapted to be unconnected to a die or device 210. The electrical contacts 240 can include solder balls, or pins, or lands. In some embodiments, the electrical contacts 240 are arranged in an array. In other embodiments, at least a portion of the plurality of pads on the one surface 221 of the package substrate 220 are adapted to receive a bonding wire, such as bonding wire 540. In still another embodiment, the plurality of pads on the one surface 221 of the package substrate 220 are outside the shadow volume 450.

Figure 10:
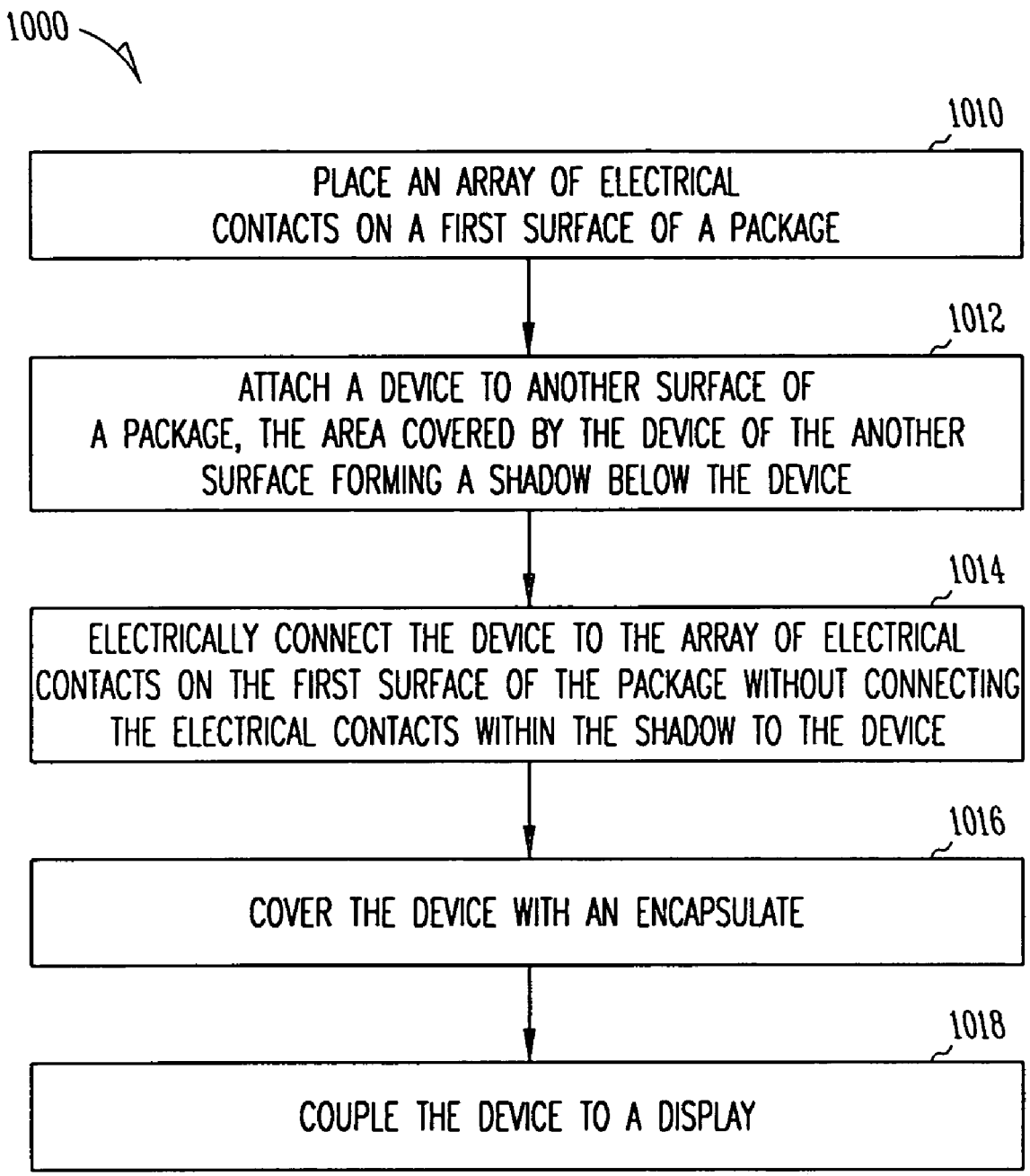
FIG. 10 is a flow diagram showing a method for forming or building a package according to an example embodiment.

FIG. 10 is a flow diagram showing a method 1000 for forming a package according to an example embodiment. The method 1000 includes placing an array of electrical contacts on a first surface of a package 1010, attaching a device to another surface of a package 1012, and electrically connecting the device to the array of electrical contacts on the first surface of the package 1014. The area covered by the device of another surface forms a shadow below the device. Electrically connecting the device to the array of electrical contacts on the first surface of the package is done without electrically connecting the electrical contacts within the shadow to the device. In some embodiments, the method also includes covering the device with an encapsulant 1016. In other embodiments, electrically coupling the device includes bonding a bonding wire to a pad on a first surface of a package. In still other embodiments, the method also includes electrically coupling the device to a display 1018.

Figure 11:
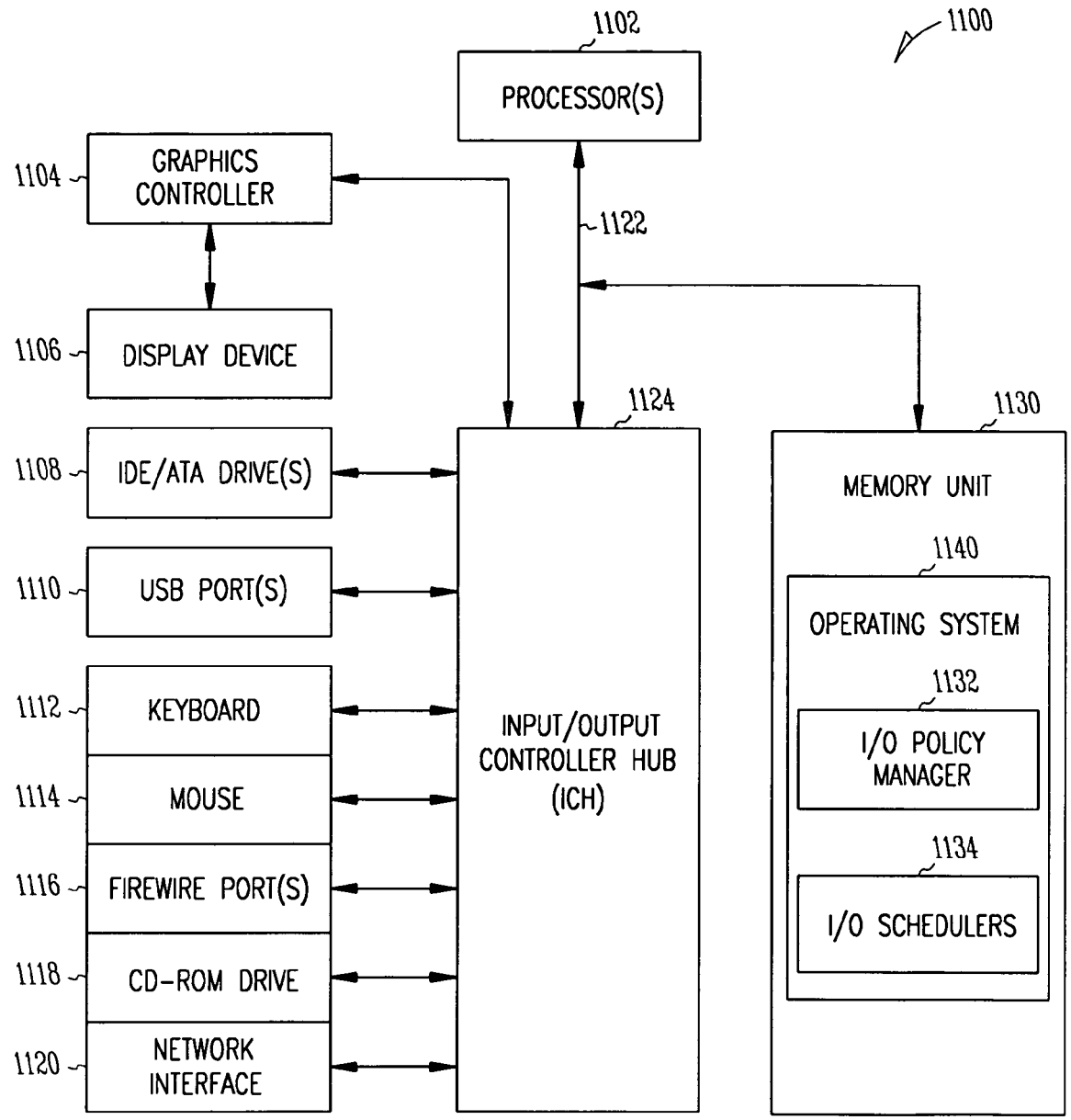
FIG. 11 illustrates a system design that includes a package having the package to package interconnections according to an embodiment of this invention.

FIG. 11 illustrates a system, such as a computer system 1100 that includes a package 200 according to an example embodiment. FIG. 11 illustrates an example computer system that uses one or more example embodiments. The package 200 can be used for any type of component used as part of a computer system 1100. As illustrated in FIG. 11, computer system 1100 comprises processor(s) 1102. The computer system 1100 also includes a memory unit 1130, processor bus 1122, and Input/Output controller hub (ICH) 1124. The processor(s) 1102, memory unit 1130, and ICH 1124 are coupled to the processor bus 1122. The processor(s) 1102 may comprise any suitable processor architecture. The computer system 1100 may comprise one, two, three, or more processors.

The memory unit 1130 includes an operating system 1140, which includes an I/O scheduling policy manager 1132 and I/O schedulers 1134. The memory unit 1130 stores data and/or instructions, and may comprise any suitable memory, such as a dynamic random access memory (DRAM), for example. The computer system 1100 also includes IDE drive(s) 1108 and/or other suitable storage devices. A graphics controller 1104 controls the display of information on a display device 1106, according to embodiments of the invention.

The Input/Output controller hub (ICH) 1124 provides an interface to I/O devices or peripheral components for the computer system 1100. The ICH 1124 may comprise any suitable interface controller to provide for any suitable communication link to the processor(s) 1102, memory unit 1130 and/or to any suitable device or component in communication with the ICH 1124. For one embodiment of the invention, the ICH 1124 provides suitable arbitration and buffering for each interface.

For one embodiment of the invention, the ICH 1124 provides an interface to one or more suitable integrated drive electronics (IDE) drives 1108, such as a hard disk drive (HDD) or compact disc read-only memory (CD ROM) drive, or to suitable universal serial bus (USB) devices through one or more USB ports 1110. For one embodiment, the ICH 1124 also provides an interface to a keyboard 1112, a mouse 1114, a CD-ROM drive 1118, and one or more suitable devices through one or more firewire ports 1116. The ICH 1124 also provides a network interface 1120 though which the computer system 1100 can communicate with other computers and/or devices. The ICH 1124 also provides an interface a graphics controller 1104. A display 1106 is communicatively coupled to the graphics controller 1104. The computer system 1100 shown includes one or more of the packages (shown in FIGS. 2-9 and described above as example embodiments). In some embodiments, the computer system includes at least one printed circuit board 100, and at least one or more packages, such as package 200, is electrically coupled to the printed circuit board 100 (shown in FIG. 1).

Although various embodiments have been described with reference to specific example embodiments, it will be evident that various modifications and changes may be made to these embodiments without departing from the broader spirit and scope of the disclosed subject matter. Accordingly, the specification and drawings are to be regarded in an illustrative rather than a restrictive sense.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments. It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A package comprising:
   a device including:
      a plurality of electrical pads; and
      having a periphery that defines a footprint;
   a package substrate including:
      a first substrate surface to which the device is attached;
      a second substrate surface; and
   a set of electrical contacts attached to the second substrate surface, wherein the electrical contacts below a footprint of the device are not electrically coupled to the electrical pads of the device, and wherein none of the electrical contacts outside the footprint of the device are not electrically coupled to the electrical pads of the device.

2. The package of claim 1 wherein the package substrate includes electrical conductors for electrically connecting at least one of the electrical contacts attached to the second substrate surface to the electrical pads of the device.

3. The package of claim 1 wherein the electrical contacts are arranged in an array on the package substrate.

4. The package of claim 3 wherein the electrical contacts include solder balls.

5. The package of claim 3 wherein the electrical contacts include pins.

6. The package of claim 3 wherein the electrical contacts include lands.

7. The package of claim 1 wherein the device includes a semiconductor.

8. The package of claim 1 wherein the device includes a processor.

9. A package substrate comprising:
   a plurality of pads on one surface;
   an area adapted to receive a device, the area corresponding to an outer periphery of a device defining a shadow area;
   a plurality of electrical contacts on another surface; and
   conductive pathways electrically connecting at least a portion of the plurality of pads to at least a portion of the plurality of electrical contacts, wherein the electrical contacts within the shadow area are adapted to be unconnected to a die, and wherein none of the electrical contacts outside the shadow area are adapted to be unconnected to the die.

10. The package of claim 9 wherein the electrical contacts include solder balls.

11. The package of claim 9 wherein the electrical contacts include pins.

12. The package of claim 9 wherein the electrical contacts include lands.

13. The package of claim 9 wherein the electrical contacts are in an array.

14. The package of claim 9 wherein at least a portion of the plurality of pads is adapted to receive a bonding wire.

15. The package of claim 9 wherein the plurality of pads are outside the shadow area.

16. The package of claim 1 further comprising an encapsulant covering the device.

17. A computer system comprising:
   a package comprising:
   a device including:
      a plurality of electrical pads; and
      having a periphery that defines a footprint;

a package substrate including:
 a first substrate surface to which the device is attached; and
 a second substrate surface; and
a set of electrical contacts attached to the second substrate surface, wherein the electrical contacts below a footprint of the device are not electrically connected to the electrical pads of the device, and wherein none of the electrical contacts outside the footprint of the device are not electrically coupled to the electrical pads of the device; and
a display communicatively coupled to the package.

18. The computer system of claim 17 further comprising a printed circuit board, the package electrically connected to the printed circuit board.

19. The computer system of claim 17 wherein the package further comprises an encapsulant covering the device.

20. The computer system of claim 17 wherein the package substrate includes:
 a set of electrical pads on the first substrate surface; and
 a plurality of electrical paths between the electrical pads on the first surface of the package substrate and the electrical contacts, wherein the electrical pads on the first substrate surface are outside the footprint.

21. The computer system of claim 17 wherein the device includes a microprocessor.

22. The computer system of claim 17 wherein the device includes a semiconductor chip.

* * * * *